United States Patent
Scharf et al.

(10) Patent No.: US 8,399,995 B2
(45) Date of Patent: Mar. 19, 2013

(54) SEMICONDUCTOR DEVICE INCLUDING SINGLE CIRCUIT ELEMENT FOR SOLDERING

(75) Inventors: Thorsten Scharf, Regensburg (DE); Horst Theuss, Wenzenbach (DE); Markus Leicht, Villach (DE)

(73) Assignee: Infineon Technologies AG, Neubiberg (DE)

( * ) Notice: Subject to any disclaimer, the term of this patent is extended or adjusted under 35 U.S.C. 154(b) by 374 days.

(21) Appl. No.: 12/355,313

(22) Filed: Jan. 16, 2009

(65) Prior Publication Data

US 2010/0181687 A1 Jul. 22, 2010

(51) Int. Cl.
*H01L 23/48* (2006.01)
*H01L 23/52* (2006.01)
*H01L 29/40* (2006.01)

(52) U.S. Cl. ........ 257/779; 257/734; 257/773; 257/782; 257/E23.023

(58) Field of Classification Search ............. 257/99, 257/472, 740, 782, 783, 784, E23.067, 734, 257/772, 779, E23.023, 773
See application file for complete search history.

(56) References Cited

U.S. PATENT DOCUMENTS

| | | | | | |
|---|---|---|---|---|---|
| 2,931,960 | A | * | 4/1960 | Herlet et al. | 257/762 |
| 2,940,022 | A | * | 6/1960 | Pankove | 257/256 |
| 2,975,085 | A | * | 3/1961 | Hunter | 257/47 |
| 3,027,529 | A | * | 3/1962 | Schofer et al. | 338/28 |
| 3,353,114 | A | * | 11/1967 | Hanks et al. | 372/43.01 |
| 3,356,914 | A | * | 12/1967 | Whigham et al. | 257/712 |
| 3,513,041 | A | * | 5/1970 | Sullivan | 438/352 |
| 3,518,494 | A | * | 6/1970 | James | 257/539 |
| 3,578,514 | A | * | 5/1971 | Lesk | 438/17 |
| 3,821,782 | A | * | 6/1974 | Hutson | 257/496 |
| 4,032,965 | A | * | 6/1977 | Cline et al. | 257/723 |
| 4,070,689 | A | * | 1/1978 | Coleman et al. | 136/255 |
| 4,212,021 | A | * | 7/1980 | Ono et al. | 257/94 |
| 4,732,866 | A | * | 3/1988 | Chruma et al. | 438/530 |
| 4,967,256 | A | * | 10/1990 | Pathak et al. | 257/112 |
| 5,031,072 | A | * | 7/1991 | Malhi et al. | 361/706 |
| 5,639,013 | A | * | 6/1997 | Jairazbhoy et al. | 228/248.1 |
| 5,684,677 | A | * | 11/1997 | Uchida et al. | 361/770 |
| 5,726,464 | A | * | 3/1998 | Kumomi et al. | 257/103 |
| 5,912,427 | A | * | 6/1999 | Willis et al. | 102/202.8 |
| 5,936,846 | A | * | 8/1999 | Jairazbhoy et al. | 361/770 |
| 6,054,760 | A | * | 4/2000 | Martinez-Tovar et al. | 257/692 |
| 6,448,589 | B1 | * | 9/2002 | Casey et al. | 257/173 |
| 7,019,397 | B2 | * | 3/2006 | Ohuchi et al. | 257/734 |
| 7,244,970 | B2 | * | 7/2007 | Cogan et al. | 257/173 |
| 7,420,262 | B2 | * | 9/2008 | Bauer et al. | 257/620 |
| 2002/0036345 | A1 | * | 3/2002 | Iseki et al. | 257/734 |
| 2003/0190770 | A1 | | 10/2003 | Yeom et al. | |
| 2004/0012034 | A1 | * | 1/2004 | Ducreux | 257/110 |
| 2004/0164406 | A1 | | 8/2004 | Hu et al. | |

(Continued)

*Primary Examiner* — Teresa M Arroyo

(74) *Attorney, Agent, or Firm* — Dicke, Billig & Czaja, PLLC

(57) ABSTRACT

A semiconductor device includes a chip. The chip includes a single circuit element formed in a semiconductor substrate, a first metal layer on a first face of the semiconductor substrate, and a second metal layer on a second face of the semiconductor substrate opposite the first face. The first metal layer and the second metal layer are configured for accessing the single circuit element. A smaller of a first width of the first face of the semiconductor substrate and a second width of the first face of the semiconductor substrate perpendicular to the first width is less than or equal to a distance between an exposed face of the first metal layer parallel to the first face of the semiconductor substrate and an exposed face of the second metal layer parallel to the second face of the semiconductor substrate.

11 Claims, 11 Drawing Sheets

U.S. PATENT DOCUMENTS

| | | | |
|---|---|---|---|
| 2005/0133785 A1* | 6/2005 | Eggers et al. | 257/48 |
| 2006/0017174 A1* | 1/2006 | Otremba | 257/778 |
| 2007/0262304 A1* | 11/2007 | Yu | 257/44 |
| 2009/0102054 A1* | 4/2009 | Theuss et al. | 257/773 |

* cited by examiner

SEMICONDUCTOR DEVICE INCLUDING SINGLE CIRCUIT ELEMENT FOR SOLDERING

BACKGROUND

Individual semiconductor components, such as diodes, transistors, and resistors are used in a wide variety of applications. Typically, the individual semiconductor components are glued or soldered onto a printed circuit board with other components to provide a desired circuit. The electrical structures for the individual semiconductor components are typically fabricated on a semiconductor wafer. The semiconductor wafer is then divided into a plurality of individual chips, each chip including an electrical structure. Each chip is then typically attached to a chip carrier (e.g., glued, soldered). Wire bonds are then applied to the chip and the carrier for accessing the electrical structure. The chip, carrier, and wire bonds are then encased with a molding compound or enclosed in another suitable housing to provide a packaged semiconductor component. Typical housings include lead frames packages, leadless packages, and surface mounted devices (SMDs). This fabrication process is complex and expensive.

For these and other reasons, there is a need for the present invention.

SUMMARY

One embodiment provides a semiconductor device. The semiconductor device includes a chip. The chip includes a single circuit element formed in a semiconductor substrate, a first metal layer on a first face of the semiconductor substrate, and a second metal layer on a second face of the semiconductor substrate opposite the first face. The first metal layer and the second metal layer are configured for accessing the single circuit element. A smaller of a first width of the first face of the semiconductor substrate and a second width of the first face of the semiconductor substrate perpendicular to the first width is less than or equal to a distance between an exposed face of the first metal layer parallel to the first face of the semiconductor substrate and an exposed face of the second metal layer parallel to the second face of the semiconductor substrate.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
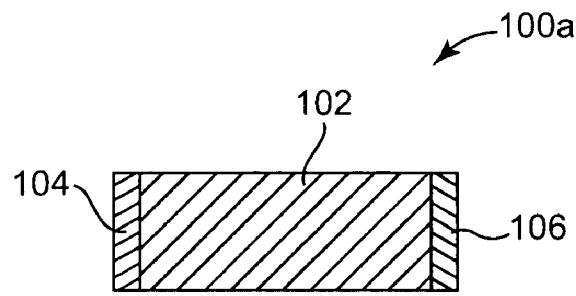
FIG. 1A illustrates a cross-sectional view of one embodiment of a semiconductor device.

FIG. 1A illustrates a cross-sectional view of one embodiment of a semiconductor device 100a. Semiconductor device 100a includes a chip including a doped semiconductor substrate 102, a first metal layer 104, and a second metal layer 106. In this embodiment, the entirety of a first face of doped semiconductor substrate 102 contacts first metal layer 104. The entirety of a second face of doped semiconductor substrate 102 opposite the first face contacts metal layer 106.

Doped semiconductor substrate 102 is suitably doped to provide an individual circuit component, such as a diode or resistor. First metal layer 104 provides a first contact for accessing the circuit component. Second metal layer 106 provides a second contact for accessing the circuit component. As such, current through semiconductor device 100a flows from one of first metal layer 104 and second metal layer 106 through doped semiconductor substrate 102 to the other one of first metal layer 104 and second metal layer 106.

Semiconductor device 100a is fabricated and packaged at the wafer level. A semiconductor wafer is suitably doped to provide the desired electrical structure. A first metal layer is then applied over the top or frontside of the wafer and a second metal layer is applied over the bottom or backside of the wafer. The wafer is then singulated to provide a plurality of semiconductor devices 100a, which has been rotated 90 degrees from its original orientation within the wafer. The fabrication costs of semiconductor device 100a are substantially reduced compared to the fabrication costs of typical individual semiconductor components. In addition, with both metal layers 104 and 106 of semiconductor device 100a soldered to the same substrate or printed circuit board, the solder connections are visible. Therefore, the solder connections are easier to inspect compared to solder connections of typical individual semiconductor components that are typically hidden underneath the component.

In one embodiment, the length and/or width of the first face of doped semiconductor substrate 102 is less than or equal to the distance between the first face and the second face of doped semiconductor substrate 102. In another embodiment, the smaller of a first width of the first face of doped semiconductor substrate 102 and a second width of the first face of doped semiconductor substrate 102 perpendicular to the first width is less than or equal to the distance between the first face and the second face of doped semiconductor substrate 102. In another embodiment, the square root of the area of the first face of doped semiconductor substrate 102 is less than or equal to the distance between the first face and the second face of doped semiconductor substrate 102.

In another embodiment, the length and/or width of the first face of doped semiconductor substrate 102 is less than or equal to the distance between the exposed face of first metal layer 104 parallel to the first face of doped semiconductor substrate 102 and the exposed face of second metal layer 106 parallel to the second face of doped semiconductor substrate 102. In another embodiment, the smaller of a first width of the first face of doped semiconductor substrate 102 and a second width of the first face of doped semiconductor substrate 102 perpendicular to the first width is less than or equal to the distance between the exposed face of first metal layer 104 parallel to the first face of doped semiconductor substrate 102 and the exposed face of second metal layer 106 parallel to the second face of doped semiconductor substrate 102. In another embodiment, the square root of the area of the first face of doped semiconductor substrate 102 is less than or equal to the distance between the exposed face of first metal layer 104 parallel to the first face of doped semiconductor substrate 102 and the exposed face of second metal layer 106 parallel to the second face of doped semiconductor substrate 102. In one embodiment, the area of the first face of doped semiconductor substrate 102 is less than or equal to approximately 4 mm$^2$.

Figure 1B:
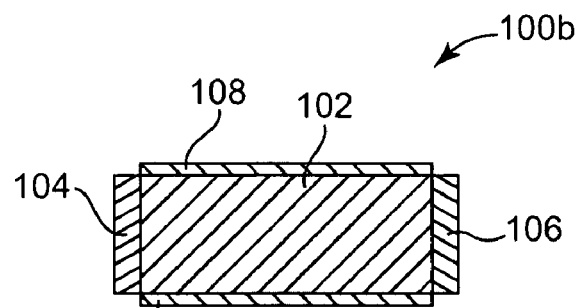
FIG. 1B illustrates a cross-sectional view of another embodiment of a semiconductor device.

FIG. 1B illustrates a cross-sectional view of another embodiment of a semiconductor device 100b. Semiconductor device 100b is similar to semiconductor device 100a previously described and illustrated with reference to FIG. 1A, except that semiconductor device 100b includes electrical insulation 108. In this embodiment, the sidewalls of doped semiconductor substrate 102 between first metal layer 104 and second metal layer 106 are electrically insulated. In one embodiment, electrical insulation 108 includes an oxide or nitride, such as $SiO_2$ or SiN, carbon, solder resist or other polymer, or other suitable material.

Figure 1C:
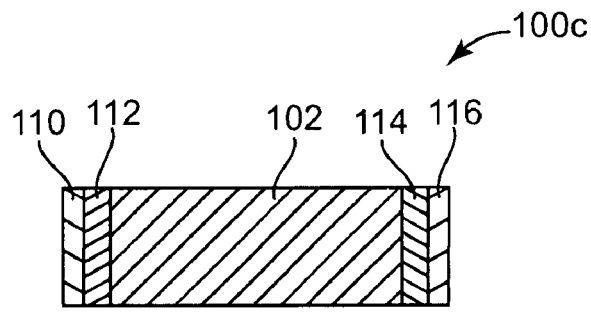
FIG. 1C illustrates a cross-sectional view of another embodiment of a semiconductor device.

FIG. 1C illustrates a cross-sectional view of another embodiment of a semiconductor device 100c. Semiconductor device 100c is similar to semiconductor device 100a previously described and illustrated with reference to FIG. 1A, except that in semiconductor device 100c first metal layer 104 is replaced by a first metal stack including layers 110 and 112 and second metal layer 106 is replaced by a second metal stack including layers 114 and 116. In this embodiment, layers 112 and 114 are selected to provide a good electrical connection to doped semiconductor substrate 102. Layers 110 and 116 contact layers 112 and 114, respectively, and are selected to provide a good electrical connection to an external circuit, such as a substrate or printed circuit board through a solder connection or another suitable connection.

Figure 1D:
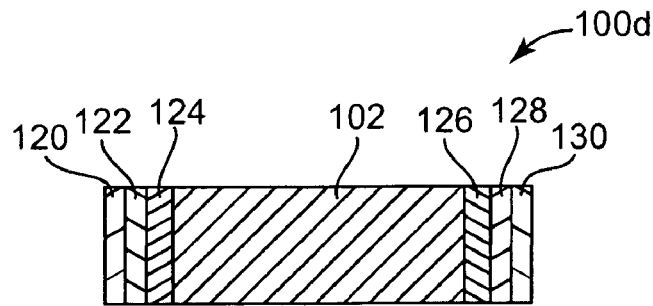
FIG. 1D illustrates a cross-sectional view of another embodiment of a semiconductor device.

FIG. 1D illustrates a cross-sectional view of another embodiment of a semiconductor device 100d. Semiconductor device 100d is similar to semiconductor device 100a previously described and illustrated with reference to FIG. 1A, except that in semiconductor device 100d first metal layer 104 is replaced by a first metal stack including layers 120, 122, and 124 and second metal layer 106 is replaced by a second metal stack including layers 126, 128, and 130. In other embodiments, the first metal stack and the second metal stack include any suitable number of metal layers. In other embodiments, the first metal stack includes a different number of metal layers compared to the second metal stack. In other embodiments, several intermediate layers are used as diffusion barriers and/or adhesion layers.

In this embodiment, layers 124 and 126 are selected to provide a good electrical connection to doped semiconductor substrate 102. Layers 122 and 128 contact layers 124 and 126, and are selected to provide a good electrical connection between layers 124 and 120 and between layers 126 and 130 respectively. Layers 120 and 130 contact layers 122 and 128, respectively, and are selected to provide a good electrical connection to an external circuit, such as a substrate or printed circuit board through a solder connection or another suitable connection. In one embodiment, layers 124 and 126 include Al and/or Ti, layers 122 and 128 include Ti and/or Ni or Ni alloys such as NiV, and layers 120 and 130 include Au and/or Ag. In other embodiments, the layers include other suitable metals.

Figure 1E:
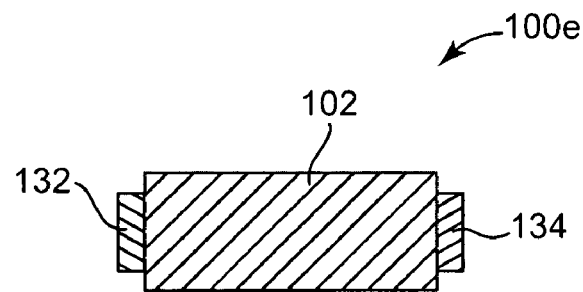
FIG. 1E illustrates a cross-sectional view of another embodiment of a semiconductor device.

FIG. 1E illustrates a cross-sectional view of another embodiment of a semiconductor device 100e. Semiconductor device 100e is similar to semiconductor device 100a previously described and illustrated with reference to FIG. 1A, except that in semiconductor device 100e first metal layer 104 is replaced by a first metal layer 132 and second metal layer 106 is replaced by a second metal layer 134. In this embodiment, first metal layer 132 and second metal layer 134 do not contact the entirety of the first face and the second face, respectively, of doped semiconductor substrate 102. In one embodiment, first metal layer 132 is substantially centered over the first face of doped semiconductor substrate 102 and second metal layer 134 is substantially centered over the second face of doped semiconductor substrate 102.

Figure 1F:
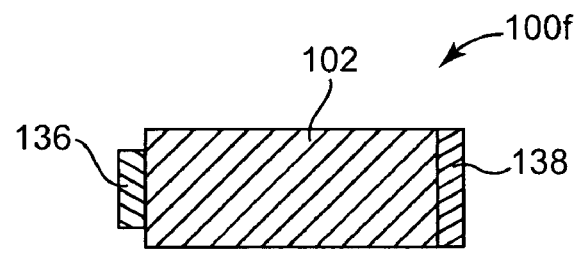
FIG. 1F illustrates a cross-sectional view of another embodiment of a semiconductor device.

FIG. 1F illustrates a cross-sectional view of another embodiment of a semiconductor device 100f. Semiconductor device 100f is similar to semiconductor device 100a previously described and illustrated with reference to FIG. 1A, except that in semiconductor device 100f first metal layer 104 is replaced by a first metal layer 136 and second metal layer 106 is replaced by a second metal layer 138. In this embodiment, first metal layer 136 does not contact the entirety of the first face of doped semiconductor substrate 102 while second metal layer 138 does contact the entirety of the second face of doped semiconductor substrate 102. In one embodiment, first metal layer 136 is substantially centered over the first face of doped semiconductor substrate 102.

Figure 1G:
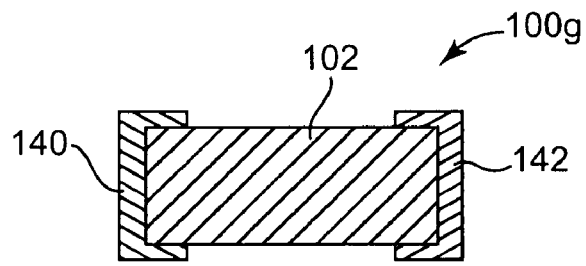
FIG. 1G illustrates a cross-sectional view of another embodiment of a semiconductor device.

FIG. 1G illustrates a cross-sectional view of another embodiment of a semiconductor device 100g. Semiconductor device 100g is similar to semiconductor device 100a previously described and illustrated with reference to FIG. 1A, except that in semiconductor device 100g first metal layer 104 is replaced by a first metal layer 140 and second metal layer 106 is replaced by a second metal layer 142. In this embodiment, first metal layer 140 and second metal layer 142 each extend over a portion of the sidewalls of doped semiconductor substrate 102 between the first face and the second face of doped semiconductor substrate 102.

Figure 1H:
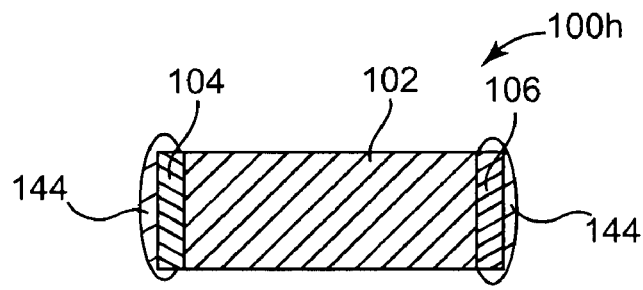
FIG. 1H illustrates a cross-sectional view of another embodiment of a semiconductor device.

FIG. 1H illustrates a cross-sectional view of another embodiment of a semiconductor device 100h. Semiconductor device 100h is similar to semiconductor device 100a previously described and illustrated with reference to FIG. 1A, except that semiconductor device 100h includes tin 144, such as Sn, SnPb, or SnBi. In this embodiment, Sn 144 encloses first metal layer 104 and second metal layer 106. Sn 144 prevents oxidation of first metal layer 104 and second metal layer 106 and may be used for soldering semiconductor device 100h to a substrate or printed circuit board.

Figure 2A:
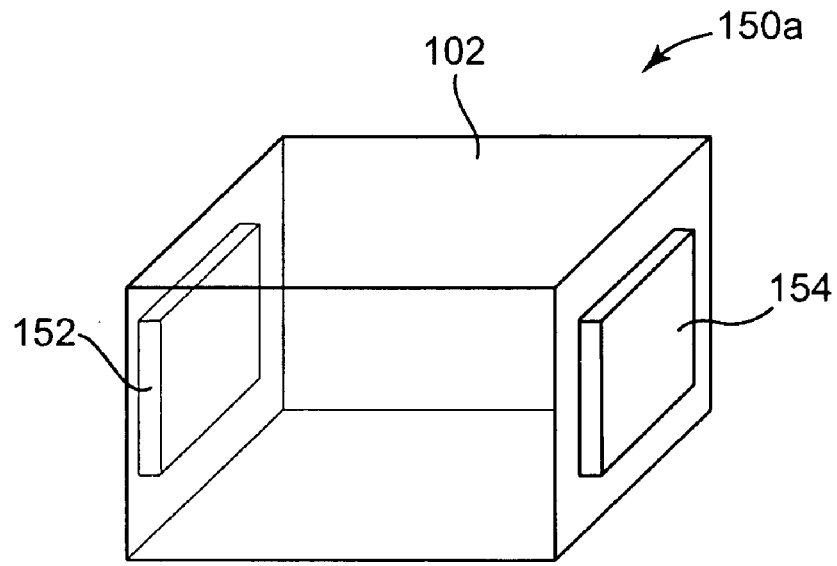
FIG. 2A illustrates a perspective view of another embodiment of a semiconductor device.

FIG. 2A illustrates a perspective view of another embodiment of a semiconductor device 150a. Semiconductor device 150a includes a chip including a doped semiconductor substrate 102, a first metal layer 152, and a second metal layer 154. In this embodiment, a portion of a first face of doped semiconductor substrate 102 contacts first metal layer 152. A portion of a second face of doped semiconductor substrate 102 opposite the first face contacts metal layer 154. In one embodiment, first metal layer 152 is substantially centered over the first face of doped semiconductor substrate 102 and second metal layer 154 is substantially centered over the second face of doped semiconductor substrate 102. While semiconductor device 150a is substantially rectangular-shaped or square-shaped in the illustrated embodiment, in other embodiments semiconductor device 150a has another suitable shape, such as circular-shaped or triangular-shaped.

Figure 2B:
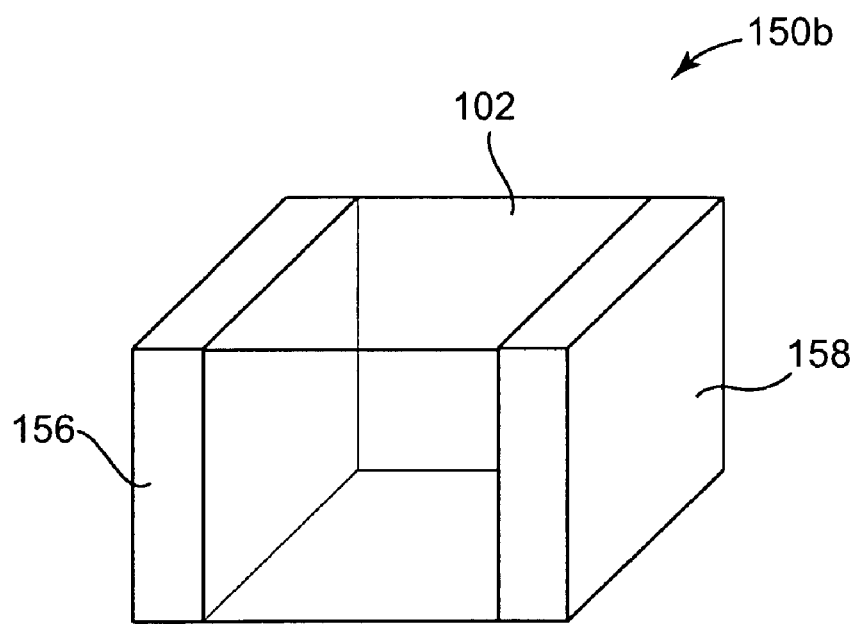
FIG. 2B illustrates a perspective view of another embodiment of a semiconductor device.

FIG. 2B illustrates a perspective view of another embodiment of a semiconductor device 150b. Semiconductor device 150b is similar to semiconductor device 150a previously described and illustrated with reference to FIG. 2A, except that in semiconductor device 150b first metal layer 152 is replaced by a first metal layer 156 and second metal layer 154 is replaced by a second metal layer 158. In this embodiment, first metal layer 156 and second metal layer 158 contact the entirety of the first face and the second face, respectively, of doped semiconductor substrate 102.

Figure 3A:
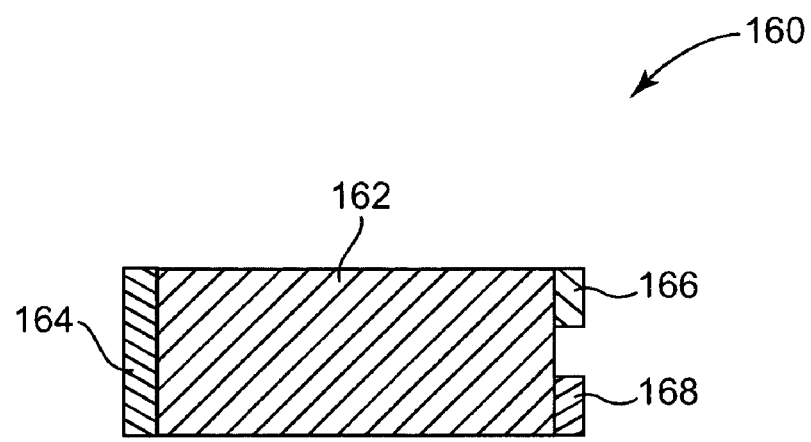
FIG. 3A illustrates a cross-sectional view of another embodiment of a semiconductor device.
Figure 3B:
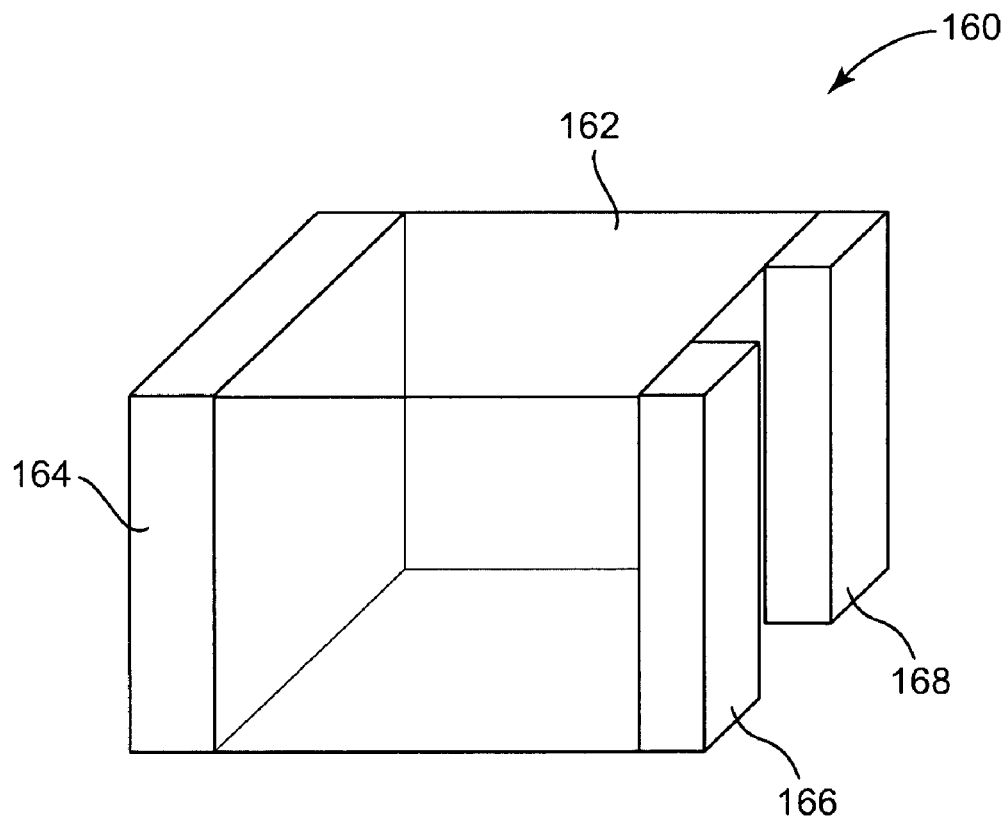
FIG. 3B illustrates a perspective view of another embodiment of a semiconductor device.

FIG. 3A illustrates a cross-sectional view and FIG. 3B illustrates a perspective view of another embodiment of a semiconductor device 160. Semiconductor device 160 includes a chip including a doped semiconductor substrate 162, a first metal layer 164, a second metal layer 166, and a third metal layer 168. In this embodiment, the entirety of a first face of doped semiconductor substrate 162 contacts first metal layer 164. A first portion of a second face of doped semiconductor substrate 162 opposite the first face contacts second metal layer 166. A second portion of the second face of doped semiconductor substrate 162 contacts third metal layer 168. Second metal layer 166 is spaced apart from third metal layer 168.

Doped semiconductor substrate 162 is suitably doped to provide an individual circuit component, such as a transistor. In one embodiment, first metal layer 164 provides a drain contact, second metal layer 166 provides a source contact, and third metal layer 168 provides a gate contact for accessing the transistor.

Semiconductor device 160 is fabricated and packaged at the wafer level. A semiconductor wafer is suitably doped to provide the desired electrical structure. A metal layer is then applied over the top or frontside of the wafer and structured for providing metal layers 166 and 168. A second metal layer is applied over the bottom or backside of the wafer for providing metal layer 164. The wafer is then singulated to provide a plurality of semiconductor devices 160, which has been rotated 90 degrees from its original orientation within the wafer.

Figure 4:
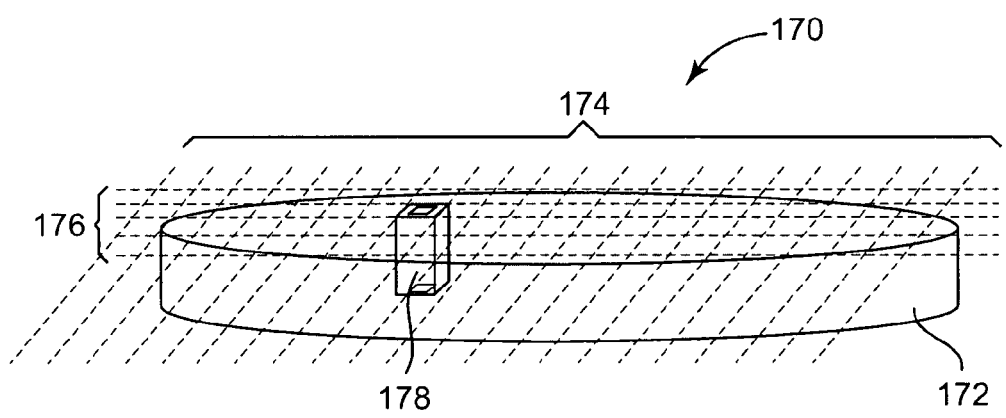
FIG. 4 illustrates a perspective view of one embodiment of a semiconductor wafer.

FIG. 4 illustrates a perspective view of one embodiment of a semiconductor wafer 170. Semiconductor wafer 170 includes a semiconductor substrate 172, such as a silicon substrate. Lines 174 and lines 176 indicate where substrate 172 is to be divided to provide a plurality of semiconductor devices, indicated for example at 178.

The following FIGS. 5-9 illustrate one embodiment of a method for fabricating a semiconductor device, such as a semiconductor device 100a-100h previously described and illustrated with reference to FIGS. 1A-1H.

Figure 5:
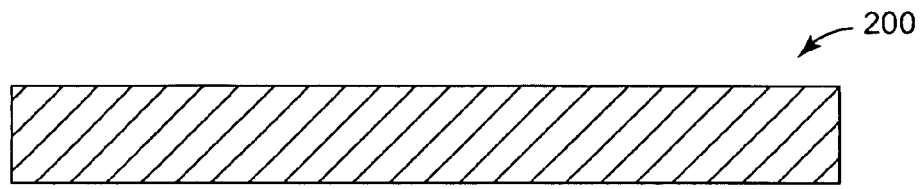
FIG. 5 illustrates a cross-sectional view of one embodiment of a semiconductor substrate.

FIG. 5 illustrates a cross-sectional view of one embodiment of a semiconductor substrate 200. In one embodiment, semiconductor substrate 200 is a silicon wafer or another suitable substrate. In one embodiment, semiconductor substrate 200 has a thickness between approximately 500 μm and 1000 μm.

Figure 6:
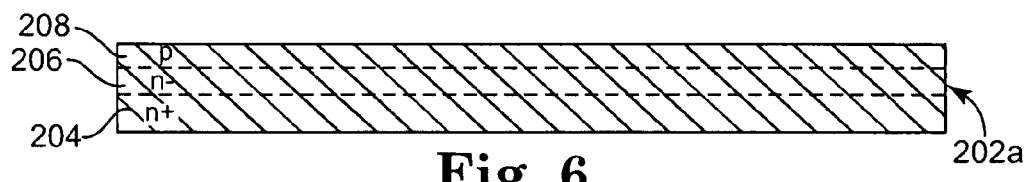
FIG. 6 illustrates a cross-sectional view of one embodiment of a doped semiconductor substrate.

FIG. 6 illustrates a cross-sectional view of one embodiment of a doped semiconductor substrate 202a. Semiconductor substrate 200 is suitably doped to provide doped semiconductor substrate 202a. In one embodiment, semiconductor substrate 200 is doped to provide an n+ doped region as indicated at 204, an n− doped region as indicated at 206, and a p doped region as indicated at 208. In another embodiment, the polarities are reversed such that region 204 is p+ doped, region 206 is p− doped, and region 208 is n doped. In this embodiment, semiconductor substrate 200 is doped for providing diodes. In other embodiments, semiconductor substrate 200 is doped for providing other suitable circuit components, such as resistors or transistors.

Figure 7:
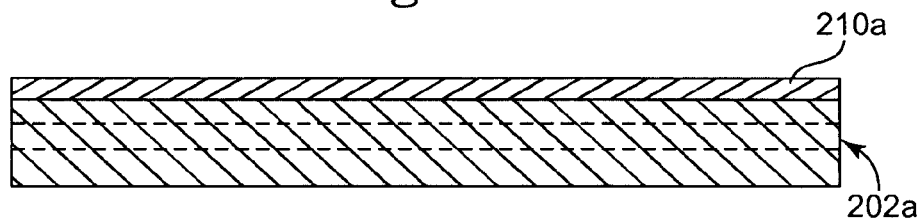
FIG. 7 illustrates a cross-sectional view of one embodiment of the doped semiconductor substrate and a first metal layer.

FIG. 7 illustrates a cross-sectional view of one embodiment of doped semiconductor substrate 202a and a first metal layer 210a. A metal, such as Cu, Al, Ni, Au, or another suitable metal is deposited over the frontside of doped semiconductor substrate 202a to provide first metal layer 210a. First metal layer 210a is deposited using chemical vapor deposition (CVD), low pressure chemical vapor deposition (LPCVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique. In one embodiment, first metal layer 210a is deposited to a thickness between approximately 1 μm and 10 μm.

Figure 8:
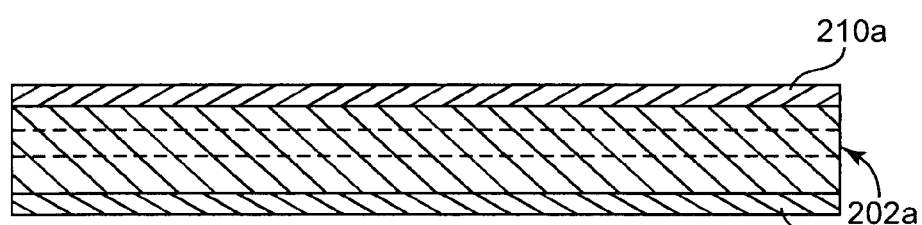
FIG. 8 illustrates a cross-sectional view of one embodiment of the doped semiconductor substrate, the first metal layer, and a second metal layer.

FIG. 8 illustrates a cross-sectional view of one embodiment of doped semiconductor substrate 202a, first metal layer 210a, and a second metal layer 212a. A metal, such as Cu, Al, Ni, Au, or another suitable metal is deposited over the backside of doped semiconductor substrate 202a to provide second metal layer 212a. Second metal layer 212a is deposited using CVD, LPCVD, HDP-CVD, ALD, MOCVD, PVD, JVD, or other suitable deposition technique. In one embodiment, second metal layer 212a is deposited to a thickness between approximately 1 μm and 10 μm.

Figure 9:
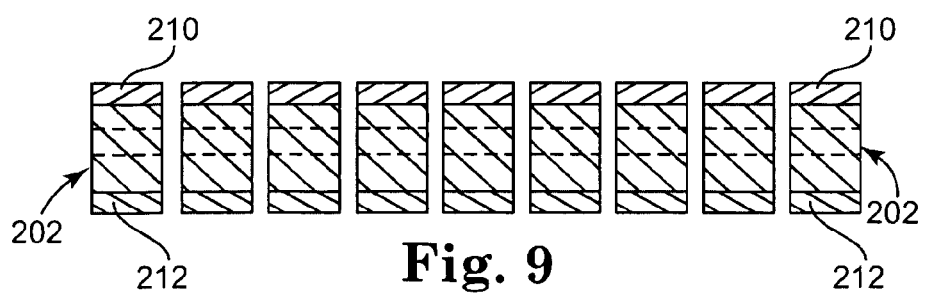
FIG. 9 illustrates a cross-sectional view of one embodiment of a plurality of semiconductor devices after singulation.

FIG. 9 illustrates a cross-sectional view of one embodiment of a plurality of semiconductor devices after singulation. Doped semiconductor substrate 202a, first metal layer 210a, and second metal layer 212a are singulated to provide a plurality of semiconductor devices each including a doped semiconductor substrate 202, a first metal layer 210, and a second metal layer 212. Doped semiconductor substrate 202a, first metal layer 210a, and second metal layer 212a are singulated using mechanical dicing, laser dicing, stealth dicing, waterjet dicing, wet or dry etching, combinations thereof, or other suitable singulation technique. In one embodiment, doped semiconductor substrate 202a, first metal layer 210a, and second metal layer 212a are singulated as indicated by lines 174 and 176 in FIG. 4.

The following FIGS. 10-18 illustrate another embodiment of a method for fabricating a semiconductor device, such as a semiconductor device 100a-100h previously described and illustrated with reference to FIGS. 1A-1H.

Figure 10:
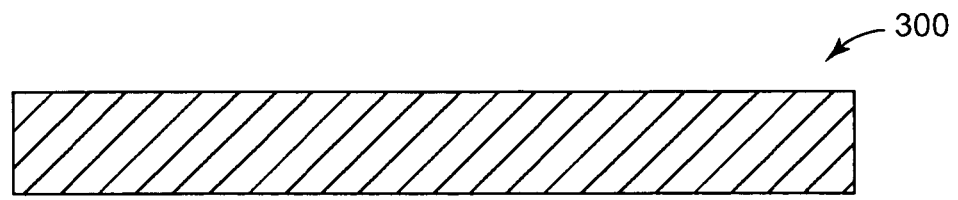
FIG. 10 illustrates a cross-sectional view of one embodiment of a semiconductor substrate.

FIG. 10 illustrates a cross-sectional view of one embodiment of a semiconductor substrate 300. In one embodiment, semiconductor substrate 300 is a silicon wafer or another suitable substrate. In one embodiment, semiconductor substrate 300 has a thickness between approximately 500 μm and 1000 μm.

Figure 11:
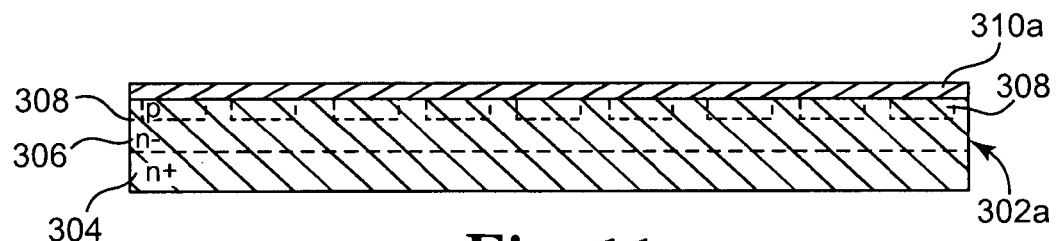
FIG. 11 illustrates a cross-sectional view of one embodiment of a doped semiconductor substrate and a dielectric layer.

FIG. 11 illustrates a cross-sectional view of one embodiment of a doped semiconductor substrate 302a and a dielectric layer 310a. Semiconductor substrate 300 is suitably doped to provide doped semiconductor substrate 302a. In one embodiment, semiconductor substrate 300 is doped to provide an n+ doped region as indicated at 304, an n− doped region as indicated at 306, and p doped regions as indicated at 308. In another embodiment, the polarities are reversed such that region 304 is p+ doped, region 306 is p− doped, and regions 308 are n doped. In this embodiment, semiconductor substrate 300 is doped for providing diodes. In other embodiments, semiconductor substrate 300 is doped for providing other suitable circuit components, such as resistors or transistors.

A dielectric material, such as $SiO_2$, SiN, or another suitable dielectric material is deposited over the frontside of doped semiconductor substrate 302a to provide dielectric layer 310a. Dielectric layer 310a is deposited using CVD, LPCVD, HDP-CVD, ALD, MOCVD, PVD, JVD, or other suitable deposition technique.

Figure 12:
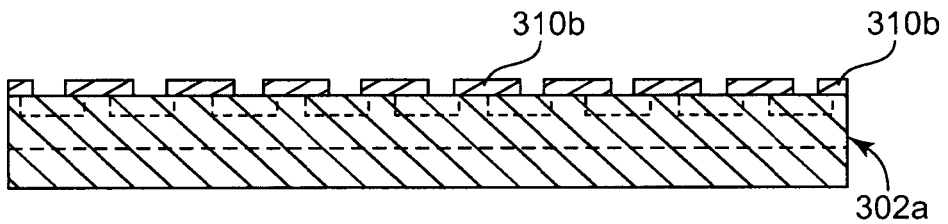
FIG. 12 illustrates a cross-sectional view of one embodiment of the doped semiconductor substrate and a structured dielectric layer.

FIG. 12 illustrates a cross-sectional view of one embodiment of doped semiconductor substrate 302a and a structured dielectric layer 310b. Portions of dielectric layer 310a are etched to expose portions of doped semiconductor substrate 302a to provide structured dielectric layer 310b. In one embodiment, dielectric layer 310a is patterned and etched using suitable photolithography and etching processes.

Figure 13:
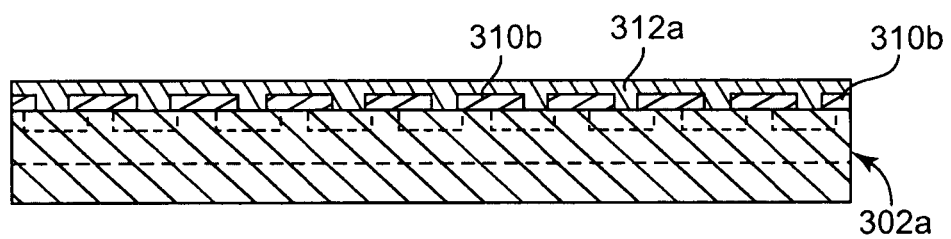
FIG. 13 illustrates a cross-sectional view of one embodiment of the doped semiconductor substrate, the structured dielectric layer, and a first metal layer.

FIG. 13 illustrates a cross-sectional view of one embodiment of doped semiconductor substrate 302a, structured dielectric layer 310b, and a first metal layer 312a. In one embodiment, a metal, such as Cu, Al, Ni, Au, or another suitable metal is deposited over structured dielectric layer 310b and exposed portions of doped semiconductor substrate 302a to provide first metal layer 312a. First metal layer 312a is deposited using CVD, LPCVD, HDP-CVD, ALD, MOCVD, PVD, JVD, or other suitable deposition technique.

In another embodiment, a metal, such as Al, Ni, Au, or another suitable metal is deposited over structured dielectric layer 310b and exposed portions of doped semiconductor substrate 302a to provide a first layer of a stack of metal layers. Another metal, such as Cu, Al, Ni, Au, or another suitable metal different from the first layer of the stack is deposited over the first layer of the stack to provide a second layer of the stack. A suitable number of additional metal layers may be deposited over the second layer of the stack to provide a stack of metal layers, which together provide first metal layer 312a.

Figure 14:
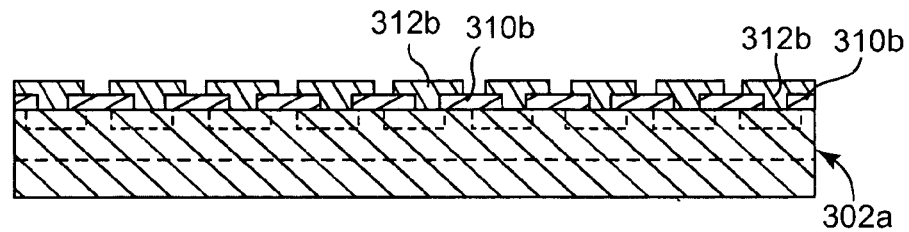
FIG. 14 illustrates a cross-sectional view of one embodiment of the doped semiconductor substrate, the structured dielectric layer, and a structured first metal layer.

FIG. 14 illustrates a cross-sectional view of one embodiment of doped semiconductor substrate 302a, structured dielectric layer 310b, and a structured first metal layer 312b. In one embodiment, portions of first metal layer 312a are etched to expose portions of structured dielectric layer 310b to provide structured first metal layer 312b. In one embodiment, first metal layer 312a is patterned and etched using suitable photolithography and etching processes.

Figure 15:
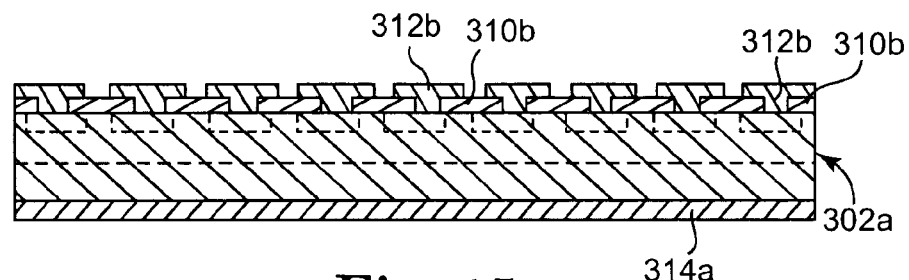
FIG. 15 illustrates a cross-sectional view of one embodiment of the doped semiconductor substrate, the structured dielectric layer, the structured first metal layer, and a second metal layer.

FIG. 15 illustrates a cross-sectional view of one embodiment of doped semiconductor substrate 302a, structured dielectric layer 310b, structured first metal layer 312b, and a second metal layer 314a. A metal, such as Cu, Al, Ni, Au, or another suitable metal is deposited over the backside of doped semiconductor substrate 302a to provide second metal layer 314a. Second metal layer 314a is deposited using CVD, LPCVD, HDP-CVD, ALD, MOCVD, PVD, JVD, or other suitable deposition technique.

In another embodiment, a metal, such as Al, Ni, Au, or another suitable metal is deposited over the backside of doped semiconductor substrate 302a to provide a first layer of a stack of metal layers. Another metal, such as Cu, Al, Ni, Au, or another suitable metal different from the first layer of the stack is deposited over the first layer of the stack to provide a second layer of the stack. A suitable number of additional metal layers may be deposited over the second layer of the stack to provide a stack of metal layers, which together provide second metal layer 314a.

Figure 16:
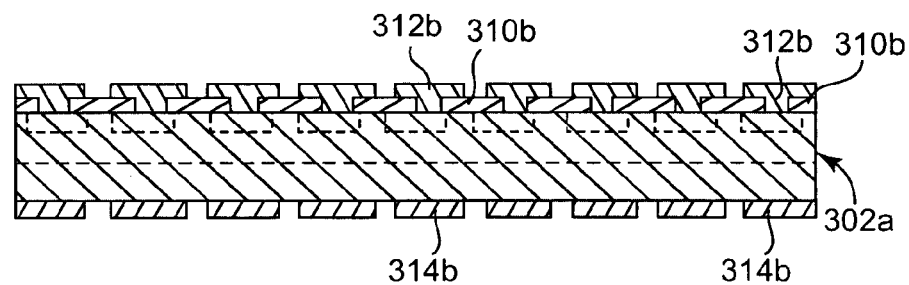
FIG. 16 illustrates a cross-sectional view of one embodiment of the doped semiconductor substrate, the structured dielectric layer, the structured first metal layer, and a structured second metal layer.

FIG. 16 illustrates a cross-sectional view of one embodiment of doped semiconductor substrate 302a, structured dielectric layer 310b, structured first metal layer 312b, and a structured second metal layer 314b. In one embodiment, portions of second metal layer 314a are etched to expose portions of doped semiconductor substrate 302a to provide structured second metal layer 314b. In one embodiment, second metal layer 314a is patterned and etched using suitable photolithography and etching processes.

Figure 17:
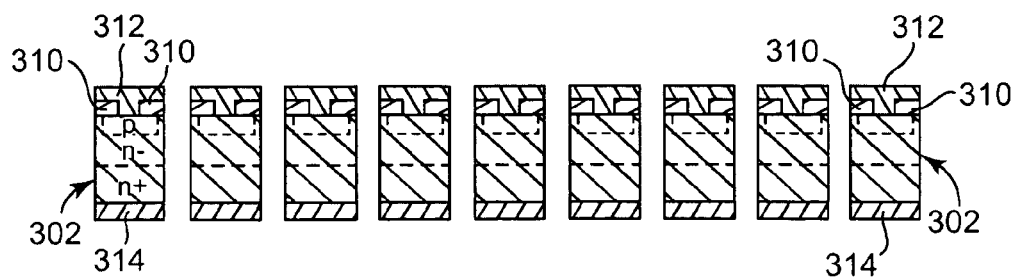
FIG. 17 illustrates a cross-sectional view of one embodiment of a plurality of semiconductor devices after singulation.

FIG. 17 illustrates a cross-sectional view of one embodiment of a plurality of semiconductor devices after singulation. Doped semiconductor substrate 302a, structured dielectric layer 310b, structured first metal layer 312b, and structured second metal layer 314b are singulated to provide a plurality of semiconductor devices each including a doped semiconductor substrate 302, a structured dielectric layer 310, a first metal layer 312, and a second metal layer 314. Doped semiconductor substrate 302a, structured dielectric layer 310b structured first metal layer 312b, and structured second metal layer 314b are singulated using mechanical dicing, laser dicing, stealth dicing, waterjet dicing, wet or dry etching, combinations thereof, or other suitable singulation technique. In one embodiment, doped semiconductor substrate 302a, structured dielectric layer 310b, structured first metal layer 312b, and structured second metal layer 314b are singulated as indicated by lines 174 and 176 in FIG. 4.

Figure 18:
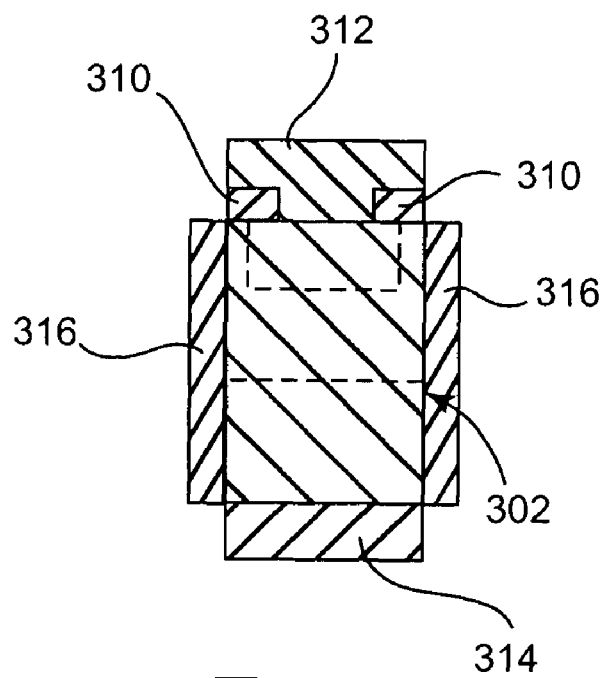
FIG. 18 illustrates a cross-sectional view of one embodiment of a semiconductor device including insulated sidewalls.

FIG. 18 illustrates a cross-sectional view of one embodiment of a semiconductor device including insulated sidewalls. In one embodiment, the exposed sidewalls of doped semiconductor substrate 302 are electrically insulated. In one embodiment, the exposed sidewalls of doped semiconductor substrate 302 are oxidized to provide insulation material 316.

Figure 19:
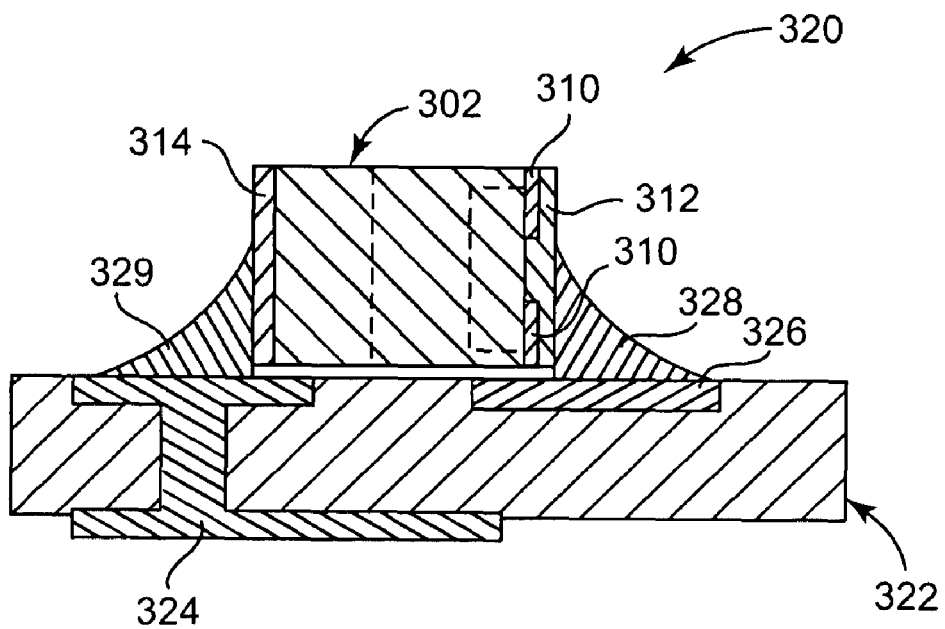
FIG. 19 illustrates a cross-sectional view of one embodiment of a semiconductor device attached to a substrate or printed circuit board.

FIG. 19 illustrates a cross-sectional view of one embodiment 320 of a semiconductor device attached to a substrate or printed circuit board. A substrate or printed circuit board 322 includes contacts 324 and 326. The semiconductor device is rotated 90 degrees from its orientation within the semiconductor wafer such that first metal layer 312 and second metal layer 314 are perpendicular to substrate or printed circuit board 322. First metal layer 312 is soldered to contact 326 as indicated at 328. Second metal layer 314 is soldered to contact 324 as indicated at 329. Solder connections 328 and 329 are visible and not hidden underneath the semiconductor device. Therefore, inspection of solder connections 328 and 329 is simplified.

The following FIGS. 20-25 illustrate another embodiment of a method for fabricating a semiconductor device. To begin, the process previously described and illustrated with reference to FIGS. 10-12 is first performed.

Figure 20:
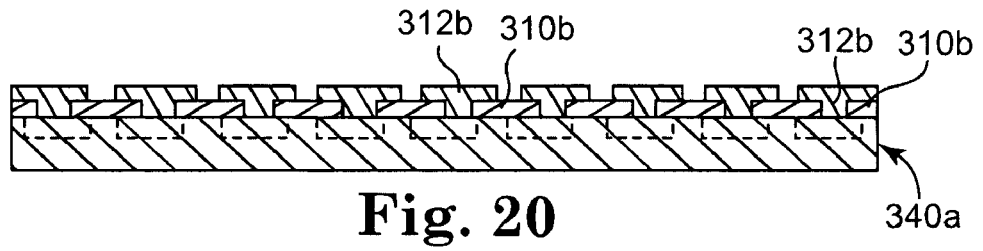
FIG. 20 illustrates a cross-sectional view of one embodiment of a doped semiconductor substrate, the structured dielectric layer, and the structured first metal layer after thinning the doped semiconductor substrate.

FIG. 20 illustrates a cross-sectional view of one embodiment of a doped semiconductor substrate 340a, structured dielectric layer 310b, and structured first metal layer 312b after thinning doped semiconductor substrate 302a. In another embodiment, first metal layer 312b is not structured. The backside of doped semiconductor substrate 302a is thinned to provide doped semiconductor substrate 340a. Doped semiconductor substrate 302a is thinned by grinding, etching, or by another suitable technique. In one embodiment, the backside of doped semiconductor substrate 302a is thinned such that the thickness of doped semiconductor substrate 340a is less than approximately 400 μm, such as 60 μm.

Figure 21:
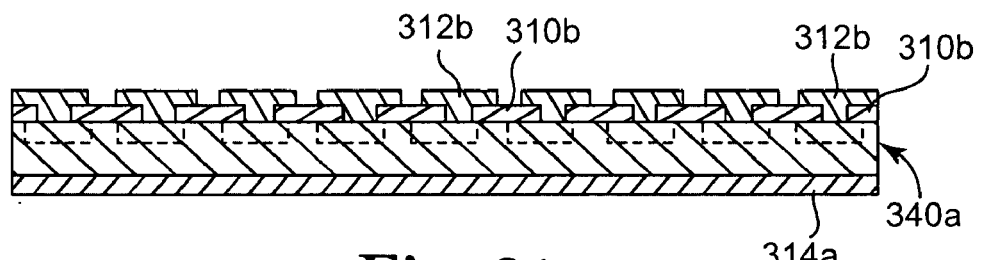
FIG. 21 illustrates a cross-sectional view of one embodiment of the doped semiconductor substrate, the structured dielectric layer, the structured first metal layer, and a second metal layer.

FIG. 21 illustrates a cross-sectional view of one embodiment of doped semiconductor substrate 340a, structured dielectric layer 310b, structured first metal layer 312b, and a second metal layer 314a. A metal, such as Cu, Al, Ni, Au, or another suitable metal is deposited over the backside of doped semiconductor substrate 340a to provide second metal layer 314a. Second metal layer 314a is deposited using CVD, LPCVD, HDP-CVD, ALD, MOCVD, PVD, JVD, or other suitable deposition technique.

Figure 22:
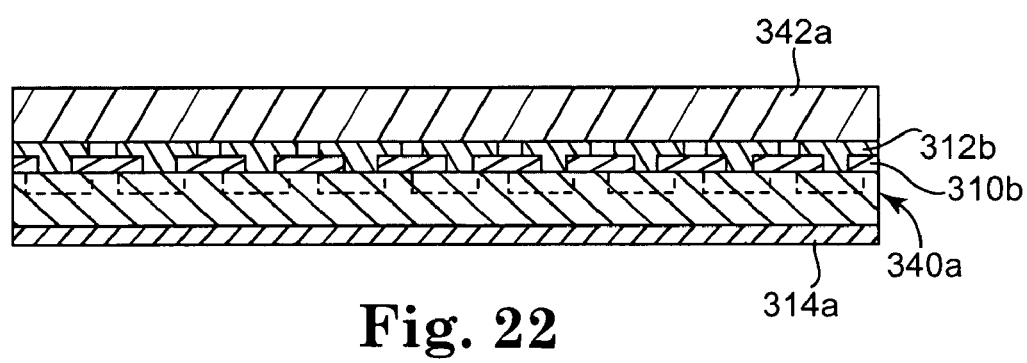
FIG. 22 illustrates a cross-sectional view of one embodiment of the doped semiconductor substrate, the structured dielectric layer, the structured first metal layer, the second metal layer, and a metal plate.

FIG. 22 illustrates a cross-sectional view of one embodiment of doped semiconductor substrate 340a, structured dielectric layer 310b, structured first metal layer 312a, second metal layer 314a, and a metal plate 342a. In this embodiment, a metal plate, such as Cu, Ni, Ag, Fe, steel, or another suitable metal plate, is attached to structured first metal layer 312b to provide metal plate 342a. Metal plate 342a is attached to structured first metal layer 312b by soldering, sintering, gluing, or another suitable technique. In one embodiment, the thickness of metal plate 342a is greater than the thickness of structured first metal layer 312b. In one embodiment, the thickness of metal plate 342a is greater than approximately 100 μm.

Figure 23:
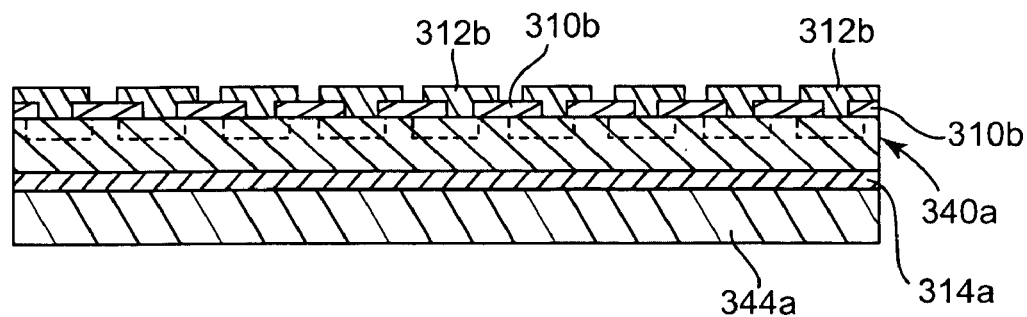
FIG. 23 illustrates a cross-sectional view of one embodiment of the doped semiconductor substrate, the structured dielectric layer, the structured first metal layer, the second metal layer, and a metal plate.

FIG. 23 illustrates a cross-sectional view of one embodiment of doped semiconductor substrate 340a, structured dielectric layer 310b, structured first metal layer 312b, second metal layer 314a, and a metal plate 344a. In this embodiment, a metal plate, such as Cu, Ni, Ag, Fe, steel, or another suitable metal plate, is attached to second metal layer 314a to provide metal plate 344a. Metal plate 344a is attached to second metal layer 314a by soldering, sintering, gluing, or another suitable technique. In one embodiment, the thickness of metal plate 344a is greater than the thickness of second metal layer 314a. In one embodiment, the thickness of metal plate 344a is greater than approximately 100 μm.

Figure 24:
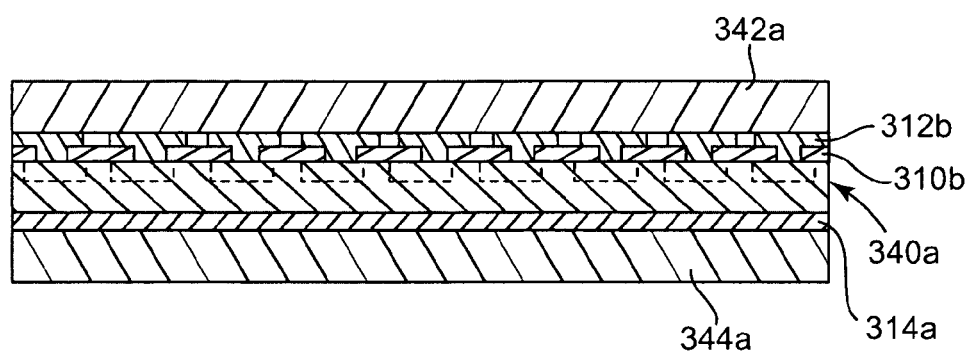
FIG. 24 illustrates a cross-sectional view of one embodiment of the doped semiconductor substrate, the structured dielectric layer, the structured first metal layer, the second metal layer, a first metal plate, and a second metal plate.

FIG. 24 illustrates a cross-sectional view of one embodiment of doped semiconductor substrate 340a, structured dielectric layer 310b, structured first metal layer 312b, second metal layer 314a, a first metal plate 342a, and a second metal plate 344a. In this embodiment, a metal plate, such as Cu, Ni, Ag, Fe, steel, or another suitable metal plate, is attached to structured first metal layer 312b to provide first metal plate 342a. First metal plate 342a is attached to structured first metal layer 312b by soldering, sintering, gluing, or another suitable technique. A metal plate, such as Cu, Ni, Ag, Fe, steel, or another suitable metal plate, is also attached to second metal layer 314a to provide second metal plate 344a. Second metal plate 344a is attached to second metal layer 314a by soldering, sintering, gluing, or another suitable technique.

Figure 25:
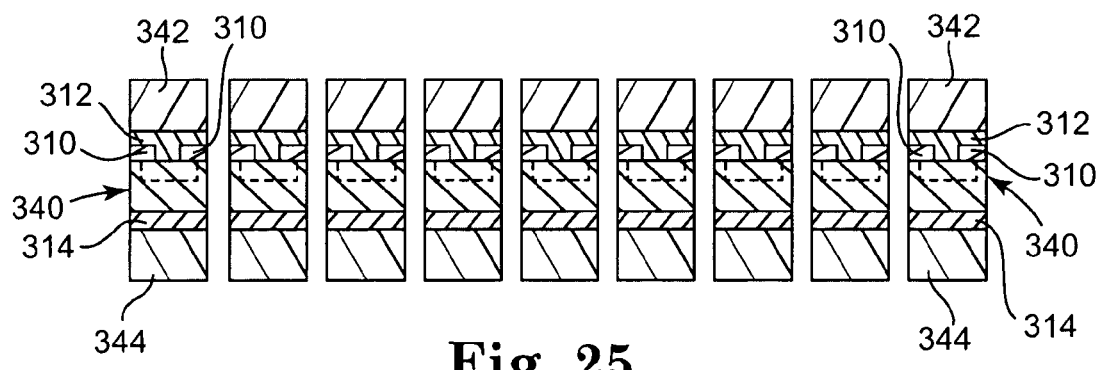
FIG. 25 illustrates a cross-sectional view of one embodiment of a plurality of semiconductor devices after singulation.

FIG. 25 illustrates a cross-sectional view of one embodiment of a plurality of semiconductor devices after singulation. Doped semiconductor substrate 340a, structured dielectric layer 310b, structured first metal layer 312b, second metal layer 314a, first metal plate 342a, and second metal plate 344a are singulated to provide a plurality of semiconductor devices each including a doped semiconductor substrate 340, a structured dielectric layer 310, a first metal layer 312, a second metal layer 314, a first metal plate 342, and a second metal plate 344. Doped semiconductor substrate 340a, structured dielectric layer 310b, structured first metal layer 312b, second metal layer 314a, first metal plate 342a, and second metal plate 344a are singulated using mechanical dicing, laser dicing, stealth dicing, waterjet dicing, wet or dry etching, combinations thereof, or other suitable singulation technique. In one embodiment, the sidewalls of each semiconductor device are then insulated. In one embodiment, the sidewalls are insulated using a process similar to the process previously described and illustrated with reference to FIG. 18. In one embodiment, first metal plate 342 and second metal plate 344 are soldered to a substrate or a printed circuit board as previously described and illustrated with reference to FIG. 19.

In another embodiment, doped semiconductor substrate 340a, structured dielectric layer 310b, structured first metal layer 312b, second metal layer 314a, and metal plate 342a as previously described and illustrated with reference to FIG. 22 are singulated to provide a plurality of semiconductor devices each including a doped semiconductor substrate 340, a structured dielectric layer 310, a first metal layer 312, a second metal layer 314, and a metal plate 342. In another embodiment, doped semiconductor substrate 340a, structured dielectric layer 310b, structured first metal layer 312b, second metal layer 314a, and metal plate 344a as previously described and illustrated with reference to FIG. 23 are singulated to provide a plurality of semiconductor devices each including a doped semiconductor substrate 340, a structured dielectric layer 310, a first metal layer 312, a second metal layer 314, and a metal plate 344.

Embodiments provide packaged single circuit elements, such as diodes, resistors, and transistors, fabricated using wafer level processing. After singulation of the single circuit elements from a semiconductor wafer, the single circuit elements can be directly soldered to a substrate or printed circuit board without further processing to package the elements. Therefore, the cost of fabricating the circuit elements is substantially reduced compared to typical packaged single circuit elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a chip comprising a single circuit element formed in a semiconductor substrate, a first metal layer on a first face of the semiconductor substrate and extending only over the first face of the semiconductor substrate, and a second metal layer on a second face of the semiconductor substrate opposite the first face and extending only over the second face of the semiconductor substrate, the first metal layer and the second metal layer configured for accessing the single circuit element, the first metal layer directly coupled to a first doped region within the semiconductor substrate, and the second metal layer directly coupled to a second doped region within the semiconductor substrate,
wherein a smaller of a width of the first face of the semiconductor substrate and a length of the first face of the semiconductor substrate perpendicular to the width is less than or equal to a distance between an exposed face of the first metal layer parallel to the first face of the semiconductor substrate and an exposed face of the second metal layer parallel to the second face of the semiconductor substrate.

2. The semiconductor device of claim 1, wherein the single circuit element comprises one of a diode, a transistor, and a resistor.

3. The semiconductor device of claim 1, wherein the first metal layer and the second metal layer are configured for directly soldering the first metal layer and the second metal layer of the chip to a same substrate.

4. The semiconductor device of claim 1, wherein the first metal layer is over an entirety of the first face of the semiconductor substrate, and
wherein the second metal layer is over an entirety of the second face of the semiconductor substrate.

5. A semiconductor device comprising:
a chip comprising a single circuit element formed in a semiconductor substrate, a first metal layer on a first face of the semiconductor substrate, and a second metal layer on a second face of the semiconductor substrate opposite the first face, the first metal layer and the second metal layer configured for accessing the single circuit element, the first metal layer directly coupled to a first doped region within the semiconductor substrate, and the second metal layer directly coupled to a second doped region within the semiconductor substrate,
wherein a smaller of a width of the first face of the semiconductor substrate and a length of the first face of the semiconductor substrate perpendicular to the width is less than or equal to a distance between an exposed face of the first metal layer parallel to the first face of the semiconductor substrate and an exposed face of the second metal layer parallel to the second face of the semiconductor substrate, and wherein an area of the first face of the semiconductor substrate is less than 4 $mm^2$.

6. A semiconductor device comprising:
a semiconductor chip comprising a first metal layer and a second metal layer, the first metal layer directly over an entirety of a frontside of the chip and directly coupled to a first doped region within the chip of a first polarity, the second metal layer directly over a backside of the chip opposite the frontside and directly coupled to a second doped region within the chip of a second polarity,
wherein a smaller of a width of the frontside of the chip and a length of the frontside of the chip perpendicular to the width is less than or equal to a distance between an exposed face of the first metal layer parallel to the frontside of the chip and an exposed face of the second metal layer parallel to the backside of the chip, and
wherein an area of the frontside of the chip is less than 4 $mm^2$.

7. The semiconductor device of claim 6, wherein the first metal layer and the second metal layer are configured for directly soldering the first metal layer and the second metal layer of the chip to a same substrate.

8. The semiconductor device of claim 6, wherein the second metal layer is over an entirety of the backside of the chip.

9. The semiconductor device of claim 6, wherein the chip comprises one of a diode, a transistor, and a resistor.

10. A semiconductor device comprising:
a chip comprising a single circuit element formed in a semiconductor substrate, a first metal layer directly contacting only a first face of the semiconductor substrate and extending only over the first face of the semiconductor substrate, and a second metal layer directly contacting only a second face of the semiconductor substrate opposite the first face and extending only over the second face of the semiconductor substrate, the first metal layer and the second metal layer configured for accessing the single circuit element, wherein a smaller of a width of the first face of the semiconductor substrate and a length of the first face of the semiconductor substrate perpendicular to the width is less than or equal to a distance between an exposed face of the first metal layer parallel to the first face of the semiconductor substrate and an exposed face of the second metal layer parallel to the second face of the semiconductor substrate.

11. The semiconductor device of claim 10, wherein an area of the first face of the semiconductor substrate is less than 4 mm$^2$.

* * * * *